United States Patent
Leary et al.

(10) Patent No.: US 12,518,908 B2
(45) Date of Patent: Jan. 6, 2026

(54) SYSTEMS AND METHODS FOR INTEGRATING INDUCTORS WITHIN PRINTED CIRCUIT BOARDS

(71) Applicant: Avago Technologies International Sales Pte. Limited, Singapore (SG)

(72) Inventors: Michael Leary, Sunnyvale, CA (US); Jeesu Kim, San Ramon, CA (US); Li Sun, San Jose, CA (US); Myung Soo Kang, Danville, CA (US); Sarah Kay Haney, San Jose, CA (US); Dong Hoon Choi, Santa Clara, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 12 days.

(21) Appl. No.: 18/428,775

(22) Filed: Jan. 31, 2024

(65) Prior Publication Data
US 2025/0246357 A1 Jul. 31, 2025

(51) Int. Cl.
H01F 27/36 (2006.01)
H01F 27/28 (2006.01)
H01F 27/29 (2006.01)
H05K 1/02 (2006.01)
H05K 1/18 (2006.01)

(52) U.S. Cl.
CPC ....... *H01F 27/2804* (2013.01); *H01F 27/292* (2013.01); *H01F 27/36* (2013.01); *H05K 1/0218* (2013.01); *H05K 1/186* (2013.01); *H01F 2027/2809* (2013.01); *H05K 2201/1003* (2013.01)

(58) Field of Classification Search
CPC ..................................................... H01F 27/36
See application file for complete search history.

(56) References Cited

U.S. PATENT DOCUMENTS

2015/0279545 A1* 10/2015 Fazelpour ........... H01F 17/0013
336/200
2017/0062120 A1 3/2017 Yun et al.
(Continued)

FOREIGN PATENT DOCUMENTS

WO 2022072473 A1 4/2022

OTHER PUBLICATIONS

Barros, C., Design and Demonstration of Embedded Inductors for High-Voltage Integrated Voltage Regulators, Dissertation, Georgia Institute of Technology, Jul. 2021, 152 pages.
(Continued)

*Primary Examiner* — Hung V Ngo
(74) *Attorney, Agent, or Firm* — Quarles & Brady LLP (57) ABSTRACT

The subject technology is directed to systems and methods for integrating inductors within printed circuit boards. In an embodiment, the subject technology provides an apparatus that includes a substrate comprising a first layer and a first inductor coupled to the first layer. The first inductor includes a second layer comprising a first metal material and a third layer comprising a second metal material. The third layer is coupled to the second layer through a first interconnect. The first inductor may be embedded within the substrate to enable efficient space utilization, leading to overall miniaturization and improved performance due to shorter signal paths and reduced parasitic effects. There are other embodiments as well.

19 Claims, 9 Drawing Sheets

(56) References Cited

U.S. PATENT DOCUMENTS

2020/0066830 A1* 2/2020 Bharath ............... H01L 23/645
2022/0406882 A1* 12/2022 Kim ................... H01F 17/0006

OTHER PUBLICATIONS

Cheon, S. et al., Highly Performed PCB Embedded Inductors Using Inverted-Patterned Ground Structure, 2 Proceedings of the 40th European Microwave Conference, IEEE, 2010, pp. 312-315.

Dou, Y. et al., PCB Embedded Inductor for High-Frequency ZVS SEPIC Converter, In 2018 IEEE Applied Power Electronics Conference and Exposition (APEC), IEEE, 2018, pp. 98-104.

Islam, A. et al., Design and Optimization of Printed Circuit Board Inductors for Wireless Power Transfer System, 4 Circuits and Systems, 2013, 4:237-244.

Karlquist, L., Design and Fabrication of Planar Inductor Using a Fully-Additive Sequential Build Up Method, Degree 5 Project, Engineering Physics and Electrical Engineering, Master's Level, Lulea University of Technology, 2021, 35 pages.

McLaughlin, P., Analysis and Design of Hybrid Switched Capacitor DC-DC Converters with Self-Resonant Merged-LC Structures, Thesis, Thayer School of Engineering, Dartmouth College, May 2022, 175 pages.

Stack Exchange Network, Electrical Engineering, Question: NFC—Design of Inductor/"Antenna" Made of PCB Traces, May 2020, 7 pages.

Suresh, S., Modeling, Design and Fabrication of Substrate-Embedded Inductors with High Inductance Density and Low DC Resistance for Integrated Voltage Regulators, Dissertation, Georgia Institute of Technology, May 2020, 125 pages.

Zhu, F., PCB-Embedded Integrated Coupled Inductor Design for Integrated VR in Smartphone Application, Paper S13.10, Virginia Tech, Center for Power Electronics Systems, 2021, 4 pages.

* cited by examiner

SYSTEMS AND METHODS FOR INTEGRATING INDUCTORS WITHIN PRINTED CIRCUIT BOARDS

FIELD OF INVENTION

The subject technology is directed to semiconductor devices.

BACKGROUND OF THE INVENTION

Inductors are devices that store energy (e.g., measured in henrys (H)) in the form of a magnetic field, which can oppose changes in the current flowing through them. Inductors are essential components of many electronic circuits, playing a pivotal role in energy storage, filtering, impedance matching, signal conditioning, and various other functions. Their applications span across a wide range of electronic devices, such as switching power supplies, radio frequency (RF) applications, and automotive electronics.

With the rapid evolution of electronics towards miniaturization, there has been a growing demand for components that can fit within the compact confines of modern devices. Various approaches involve using surface mounting technology (SMT) by mounting an inductor directly onto the surface of a printed circuit board (PCB). However, it remains challenging to achieve optimal performance while ensuring efficient energy storage and minimizing interference in high-density circuits.

Various approaches for integrating inductors have been explored, but they have proven to be insufficient. It is important to recognize the need for new and improved inductor modules.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

The subject technology is directed to systems and methods for integrating inductors within printed circuit boards. In an embodiment, the subject technology provides an apparatus that includes a substrate comprising a first layer and a first inductor coupled to the first layer. The first inductor includes a second layer comprising a first metal material and a third layer comprising a second metal material. The third layer is coupled to the second layer through a first interconnect. The first inductor may be embedded within the substrate to enable efficient space utilization, leading to overall miniaturization and improved performance due to shorter signal paths and reduced parasitic effects. There are other embodiments as well.

Some approaches for implementing inductors on printed circuit boards involve surface-mount technology. For instance, the term "surface-mount technology inductors" or "SMT inductors" may refer to inductors that are designed to be mounted onto the surface of a PCB. The term "printed circuit board" or "PCB" may refer to substrates used in electronics to mechanically support and electrically connect electronic components using conductive pathways or traces. A PCB may include one or more layers of conductive material (e.g., copper), separated by insulating material (e.g., epoxy), and have electronic components attached to it, such as resistors, capacitors, transistors, and integrated circuits. They are commonly used in a wide variety of electronic applications, including filters, oscillators, transformers, and/or the like. Despite their ubiquity, SMT inductors present various challenges, including limited volume utilization due to height restrictions imposed by board thickness and clearance for other components, leading to a compromise between the inductor's physical footprint and its performance. The proximity of SMT inductors to one another can also pose challenges in managing coupling and isolation due to potential magnetic interference. Moreover, the incorporation of multiple SMT inductors introduces added cost and complexity, as each necessitates separate placements and interconnecting vertical wires.

In various embodiments, the subject technology provides semiconductor devices that include dedicated region or module within the PCB for inductors. This integration allows for multiple inductors to be incorporated into the semiconductor package, reducing the overall footprint and manufacturing costs. By embedding inductors into a PCB substrate, the subject technology enables multiple layers of metal to be placed in closer proximity, contrary to the traditional desire for separation in SMT inductors. This design not only minimizes parasitic effects but also leverages the dielectric properties of the PCB material to improve inductor quality, ensuring the signal quality and stability of the circuit. Accordingly, the subject technology provides an efficient use of space and material resources, enabling a dense, high-performing, and cost-effective electronic component.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the subject technology is not intended to be limited to the embodiments presented but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes an apparatus comprising a substrate. The substrate comprises: a first layer; and a first inductor coupled to the first layer. The first inductor comprises: a second layer comprising a first metal material; a first interconnect coupled to the second layer; a third layer coupled to the second layer through the first interconnect, the third layer comprising a second metal material. The first inductor is characterized by a first thickness, the first thickness is less than or equal to 250 um.

Implementations may include one or more of the following features. The apparatus further comprises a first circuit coupled to a first side of the substrate, the first circuit comprising a second side. A first distance between the second layer and the second side is less than or equal to 300 um. The apparatus further comprises a fourth layer coupled to the first layer, the fourth layer being configured to provide electromagnetic interference shielding for the first inductor. The apparatus further comprises a second interconnect coupled to the fourth layer, a second distance between the second interconnect and the first inductor being greater than or equal to 50 um. The first layer comprises a first opening, the second interconnect comprises a first region positioned in the first opening. The apparatus further comprises a fifth layer coupled between the second layer and the third layer, the fifth layer comprising a first dielectric material. The first layer comprises a pre-impregnated material. The first inductor is characterized by a quality factor of greater than or equal to 20. The first inductor is characterized by an inductance value of greater than 1 nH and less than 20 nH.

According to another embodiment, the subject technology provides an apparatus that comprises a substrate, the substrate comprising: a first layer characterized by a first thickness of less than or equal to 200 um; and a first inductor coupled to the first layer. The first inductor comprises: a second layer comprising a first metal material; a first interconnect coupled to the second layer; and a third layer coupled to the second layer through the first interconnect, the third layer comprising a second metal material. The first inductor is characterized by an inductance value of greater than 1 nH and less than 20 nH.

Implementations may include one or more of the following features. The apparatus further comprises a second inductor coupled to the first layer, a first distance between the first inductor and the second inductor being less than or equal to 0.1 mm. The apparatus further comprises a first circuit coupled to a first side of the substrate, the first circuit comprising a second side. A second distance between the second layer and the second side is less than or equal to 300 um. The apparatus further comprises a fourth layer coupled to the first layer, the fourth layer being configured to provide electromagnetic interference shielding for the first inductor. The apparatus further comprises a second interconnect coupled to the fourth layer. The first layer comprises a pre-impregnated material. The second layer and the third layer are characterized by a third distance of greater than or equal to 18 um.

According to yet another embodiment, the subject technology provides an apparatus comprising: a first circuit comprising a first side; and a substrate coupled to the first circuit. The substrate comprises: a first layer; and a first inductor coupled to the first layer, the first inductor comprising: a second layer comprising a first metal material; a first interconnect coupled to the second layer; a third layer coupled to the second layer through the first interconnect, the third layer comprising a second metal material. A first distance between the second layer and the first side is less than or equal to 300 um. In some embodiments, the first distance is less than or equal to 80 um. The apparatus further comprises a fourth layer coupled to the first layer, the fourth layer being configured to provide electromagnetic interference shielding for the first inductor. The apparatus further comprises a fifth layer coupled between the second layer and the third layer, the fifth layer comprising an epoxy resin material or a photo definable material.

Figure 1:
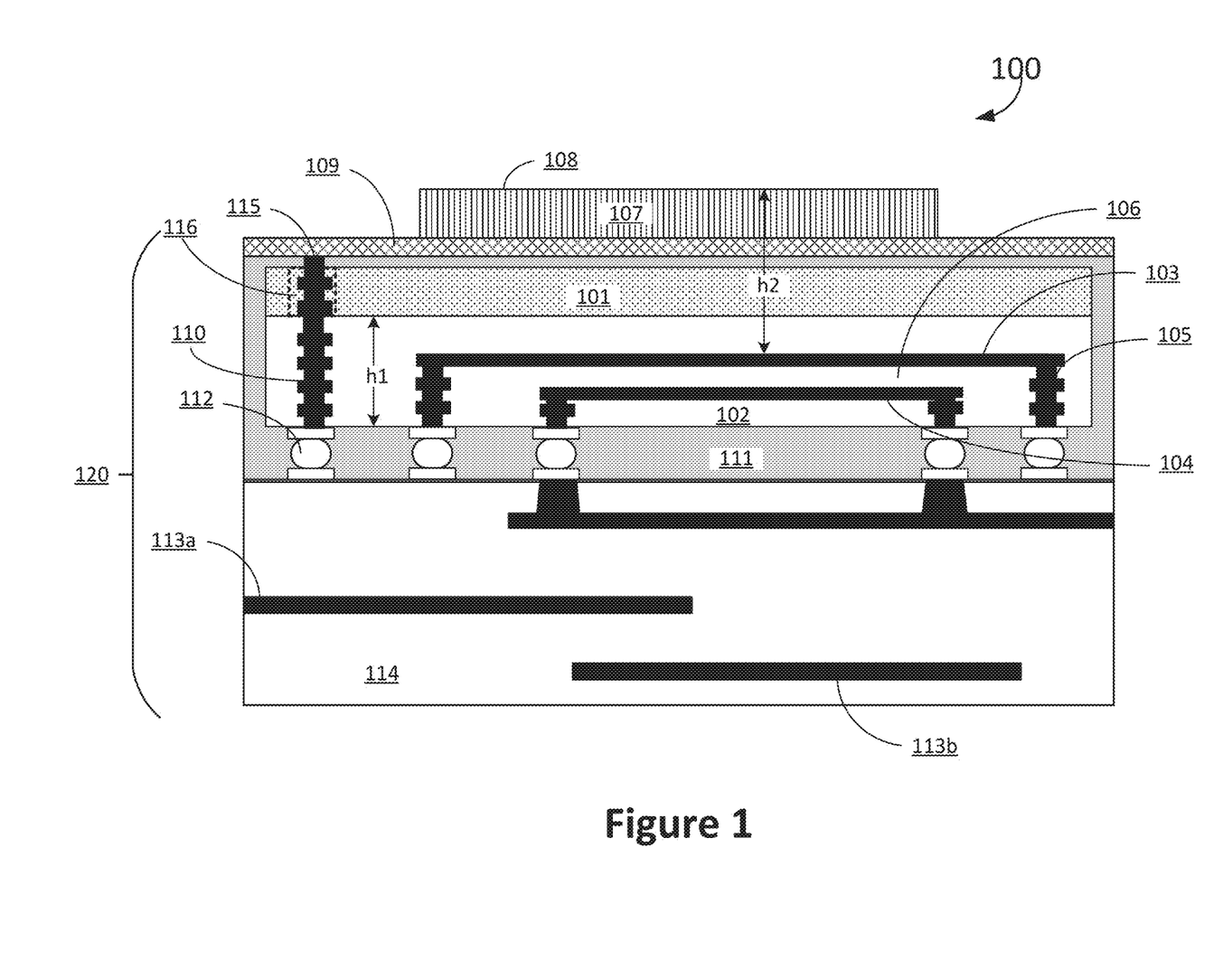
FIG. 1 is a simplified diagram illustrating a cross-section view of an apparatus having an inductor module according to embodiments of the subject technology.

FIG. 1 is a simplified diagram illustrating a cross-section view of apparatus 100 having an inductor module according to embodiments of the subject technology. This diagram merely provides an example, which should not unduly limit the scope of the claims.

As shown, apparatus 100 includes substrate 120. As an example, the term "substrate" may refer to a material or a structure that supports or carries other components or devices. Substrate 120 may be a package substrate, an interposer of an integrated device, and/or the like. Substrate 120 may include, without limitation, one or more materials such as silicon, organic materials, ceramics, diamonds, or any combination thereof. In some cases, substrate 120 may be a printed circuit board, which may include one or more layers of conductive material (e.g., copper), separated by insulating material (e.g., epoxy), and have electronic components attached to it, such as resistors, capacitors, transistors, and integrated circuits. As an example, apparatus 100 further includes circuit 107 (e.g., a first circuit) coupled to substrate 120. Circuit 107 may include an integrated circuit such as a microprocessor, memory chip, digital signal processor, system-on-chip (SoC), a system-in-package (SiP), a multi-chip module (MCM), and/or the like. Depending on the implementation, circuit 107 may be coupled to substrate 120 via a joint (not shown), which may include, without limitation, a solder-based joint (e.g., micro bumps) or a solderless joint (e.g., hybrid or direct copper bonds).

In various implementations, substrate 120 includes inductor 102 (e.g., a first inductor). For example, the term "inductor" may refer to a passive electronic component that converts electrical energy into a magnetic field and may be used in various applications, such as filtering, impedance matching, energy storage, and/or electromagnetic (EMI) suppression. In some embodiments, inductor 102 is partially embedded in substrate 120. In other words, inductor 102 is partially enclosed or surrounded by substrate 100—instead of being fully exposed on a surface of substrate 120—creating a compact and integrated design that allows for enhanced electrical performance and a reduction in the overall profile of apparatus 100.

In some embodiments, substrate 120 includes region 111 (e.g., a cavity or recess within the substrate) configured to accommodate one or more inductors (e.g., inductor 102), which may improve the performance and efficiency of the inductors by reducing the parasitic effects and the interference with other components on substrate 120. The cavity may have a shape and a size that match the inductors, or it may have some extra space for adjustment. In some cases, region 111 may be filled with a dielectric material, such as epoxy, ceramic, or plastic, to protect inductor 102 and to isolate it from other components on substrate 120. Depending on the implementation, inductor 102 may be positioned on either side (e.g., top or bottom) of substrate 120.

According to some embodiments, layer 101 (e.g., a first layer) may be coupled to inductor 102. Layer 101 may include a layer of material that is used to provide mechanical support and protection for inductor 102. In some cases, layer 101 may help to isolate inductor 102 from other components on substrate 120 and reduce the parasitic effects, such as stray capacitance and electromagnetic interference. Layer 101 may facilitate alignment during assembly and ensure consistent spacing between inductor 102 and other components or layers, which is important for maintaining desired inductance values and quality (Q) factors. In various embodiments, layer 101 may comprise various materials including, without limitation, pre-impregnated material, ceramic, glass, plastic, or other dielectric materials. For example, the term "pre-impregnated" or "prepreg material" may refer to a composite material made of fiber (e.g., glass fiber) and polymer matrix (e.g., epoxy or phenolic resin). The polymer matrix may be partially cured and in a tacky, workable state, allowing it to be easily manipulated and shaped before final curing. In some examples, layer 101 may include a prepreg material, such as polyphenylene glycol (PPG) and glass fiber, which may improve the mechanical stability and reliability of substrate 120, especially under thermal stress and vibration. Depending on the implementation, layer 101 may be partially removed (e.g., by grinding), which allows for a high degree of control over the thickness of substrate 100 to achieve the desired electrical and mechanical properties of inductor 102. For instance, layer 101 may be characterized by a thickness of less than or equal to 200 um. In some cases, a thickness of layer 101 may be greater than or equal to 100 um. In some examples, a thickness of layer 101 may be less than or equal to 150 um.

Inductor 102 may have different designs, depending on the electrical characteristics and space limitations of substrate 120. For example, inductor 102 may be a spiral, solenoid, toroidal, or planar inductor. As an example, inductor 102 may be a solenoid inductor, which may be characterized by a helical structure. The solenoid inductor can offer a high-quality factor by reducing eddy current losses within the substrate and inductor trace, which results in a more efficient magnetic field generation per turn of the inductor. Additionally, the solenoid structure allows for a uniform magnetic field across the inductor's axis, which can be beneficial in applications requiring a stable inductance over a range of operating conditions. In various implementations, inductor 102 includes layer 103 (e.g., a second layer) and layer 104 (e.g., a third layer). Layer 103 may include a first metal material, which may include, without limitation, copper, silver, gold, aluminum, iron, and/or the like. Layer 104 may include a second metal material, which may include, without limitation, copper, silver, gold, aluminum, iron, and/or the like. Depending on the implementation, the first metal material and the second metal materials may be the same or different. In various examples, layer 104 may be coupled to layer 103 through interconnect 105 (e.g., a first interconnect). The term "interconnect" may refer to a physical connection between different components or sections of a semiconductor device. For example, interconnect 105 may include, without limitation, metal traces, vias, and/or other conductive materials and structures.

In various implementations, inductor 102 further includes layer 106 (e.g., a fifth layer) coupled between layer 103 and layer 104. Layer 106 may be configured to electrically insulate the conductive layers from each other (e.g., layer 103 and layer 104), preventing short circuits and reducing the eddy current losses. For instance, layer 106 may include a first dielectric material, which may include, without limitation, epoxy resin materials such as resin coated copper (RCC) and ajinomoto build-up film (ABF), or photo definable materials such as photosensitive polyimide (PID). The term "epoxy resin material" may refer to a polymer material that has epoxide groups, which may react with a hardening agent to form a rigid, thermoset plastic. The term "photo definable material" may refer to material that changes its physical properties when exposed to light. In various implementations, photo definable material may be patterned to create inductor coils or vias using photolithography.

The thickness of inductor 102 would impact the manufacturing process and the inductor's functional performance, such as electrical characteristics (e.g., inductance, Q factor, etc.) and thermal management. Additionally, appropriate inductor thickness ensures compatibility with assembly equipment and the reliability of solder connections. Depending on the implementation, a thickness of inductor 102 may be optimized to enhance the device's performance and longevity. For instance, inductor 102 may be characterized by a thickness (e.g., denoted as h1) of less than or equal to 250 um. In some cases, a thickness of inductor 102 may be greater than or equal to 150 um.

In various implementations, apparatus 100 includes a semiconductor package, which may refer to a physical housing that contains one or more semiconductor devices or circuits (e.g., circuit 107), protecting them from environmental contaminants, mechanical stress, and/or electrical interference. Circuit 107—which could be an integrated circuit or other electronic component—may be positioned within the semiconductor package and coupled to substrate 120. Substrate 120 serves as a platform providing mechanical support and electrical connectivity for various components, including circuit 107 and inductor 102. A distance between inductor 102 and a side of the semiconductor package may affect the overall functionality and efficiency of apparatus 100. For example, the term "a side of a semiconductor package" may refer to a top or bottom surface of the semiconductor package. Depending on the implementation, a side of the semiconductor package may be a side of circuit 107, an inner surface of the package lid or encapsulating material, and/or the like. Maintaining a predetermined distance (or distance range) between inductor 102 and a side of the semiconductor package is important to prevent potential interference and allow for adequate encapsulation and heat dissipation. For example, circuit 107 may include a side 108. A distance between layer 103 and side 108 (e.g., denoted as h2) may be less than or equal to 300 um. In some cases, distance h2 may be less than or equal to 80 um. In some examples, distance h2 may be greater than or equal to 20 um.

In certain embodiments, apparatus 100 further includes layer 109 (e.g., a fourth layer) coupled to layer 101. Layer 109 may be configured to provide electromagnetic interference shielding for inductor 102 and/or other sensitive components within substrate 120. The term "electromagnetic interference" may refer to a disturbance that affects an electrical circuit (e.g., inductor 102) due to an external source of electromagnetic radiation or conduction. Electromagnetic interference can cause unwanted noise, signal distortion, or power loss in the inductor. In some examples, layer 109 may include a layer of conductive material, such as copper, nickel, aluminum, silver, steel, and/or the like. Layer 109 may block undesirable electromagnetic interference and radio frequency interference, preventing it from reaching inductor 102 or other sensitive components within the semiconductor package. In some cases, it can provide a low-impedance path to the ground, helping to maintain signal integrity across apparatus 100. By doing so, layer 109 enhances the signal-to-noise ratio and reduces the risk of crosstalk between components, particularly in high-frequency applications that are more susceptible to interference.

According to some embodiments, apparatus 100 further includes interconnect 110 (e.g., a second interconnect). Interconnect 110 may be coupled to layer 109, facilitating the connection between layer 109 and other components within the package (e.g., ground planes or external structures). For example, interconnect 110 may include, without limitation, metal traces, vias, and/or other conductive materials and structures. Interconnect 110 may include, without limitations, copper, gold, aluminum, steel, nickel, silver, conductive polymers, and/or the like. In some embodiments, interconnect 110 may be implemented as a via filled with conductive paste or electroplated metal, a wire bond, or the like.

Depending on the implementation, apparatus 100 may include one or more interconnects 110 surrounding inductor 102 to prevent the external electromagnetic interference from inducing noise in the inductor. For instance, a distance between interconnect 110 and inductor 102 may be greater than or equal to 50 um. In certain embodiments, layer 101 includes opening 115 (e.g., a first opening), and interconnect 110 includes a region 116 positioned in opening 115. Layer 109 and interconnect 110 act as a shield that enhances the overall resilience of the semiconductor package against electrical noise, and the shield thus is beneficial in high-frequency or RF applications. It allows inductor 102 to be closely packed with other components without the risk of electromagnetic interference. Such a configuration not only conserves space within the semiconductor package but also ensures that the inductor functions efficiently within the high-density design by providing a separation from surrounding elements.

In various implementations, inductor 102 may be coupled to the rest of substrate 120 (e.g., region 114). For instance, inductor 102 may be coupled to region 114 through interconnect 112. Depending on the implementation, interconnect 112 may include, without limitation, vias, traces, wires, bumps, solder balls, conductive pads, and/or the like. Interconnect 112 provides a mechanical and electrical connection between inductor 102 and region 114, facilitating the integration of inductor 102 within substrate 120. Region 114 represents a section of substrate 120, which may support and interconnect various electronic components of apparatus 100, including inductor 102. Region 114 may include one or more layers including, without limitation, conductive traces, grounding planes, dielectric materials, or other components that together form the circuitry within substrate 120. For instance, region 114 includes one or more layers (e.g., layers 113a and 113b) configured for various functions such as signal transmission, power distribution, heat dissipation, and/or the like.

It is to be appreciated that interconnect 112 not only secures inductor 102 physically but also helps electrical integration into the substrate's circuitry, enabling inductor 102 to perform various functions, such as filtering signals or storing energy. By allowing for a more compact arrangement of components, the integration simplifies the assembly process, reduces the overall footprint of the electronic device, and enhances the inductor's performance by ensuring a reliable electrical connection within a controlled electromagnetic environment.

Figure 2A:
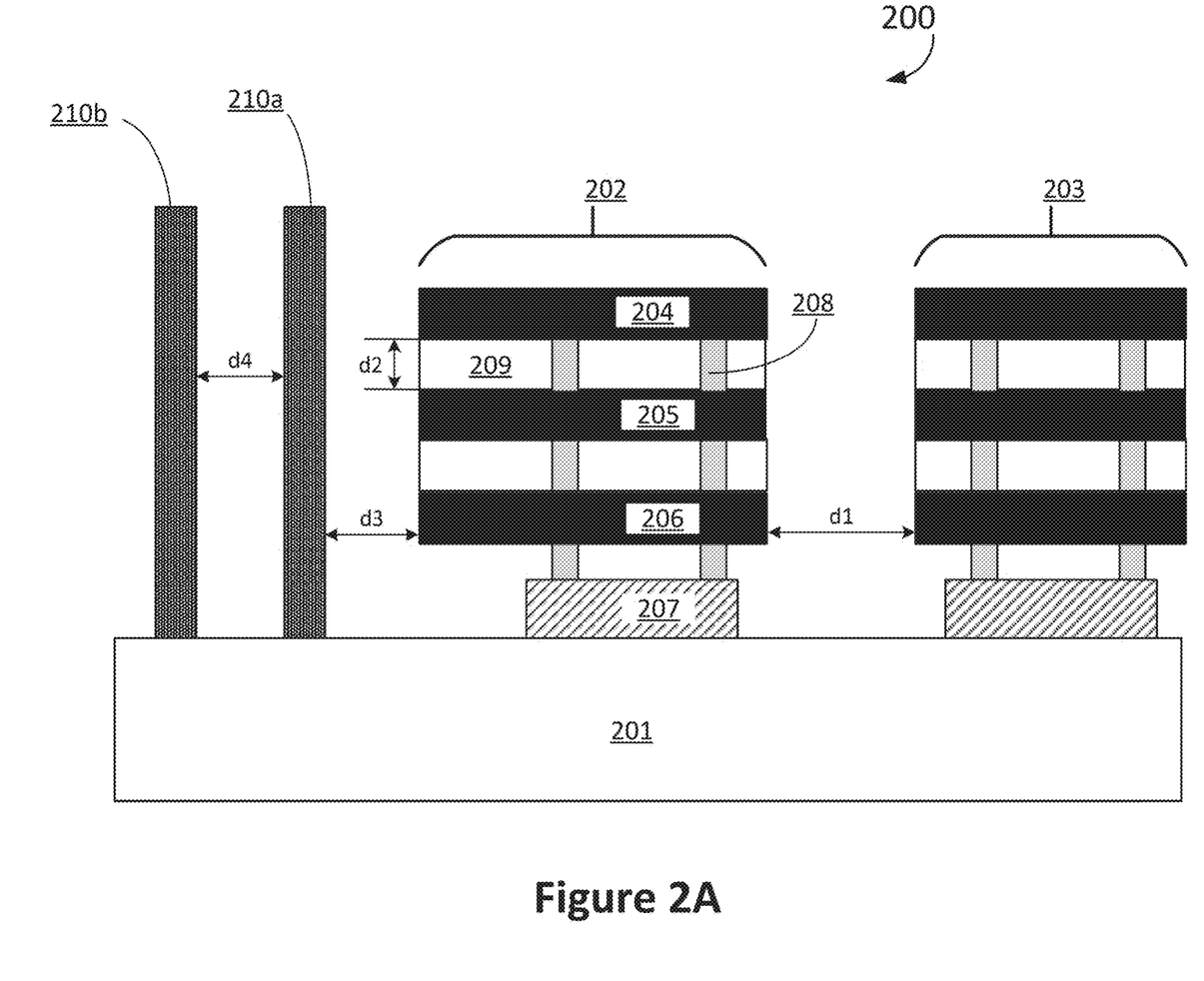
FIGS. 2A-2B are simplified diagrams illustrating a cross-section view of a substrate having an inductor module according to embodiments of the subject technology.
Figure 2B:
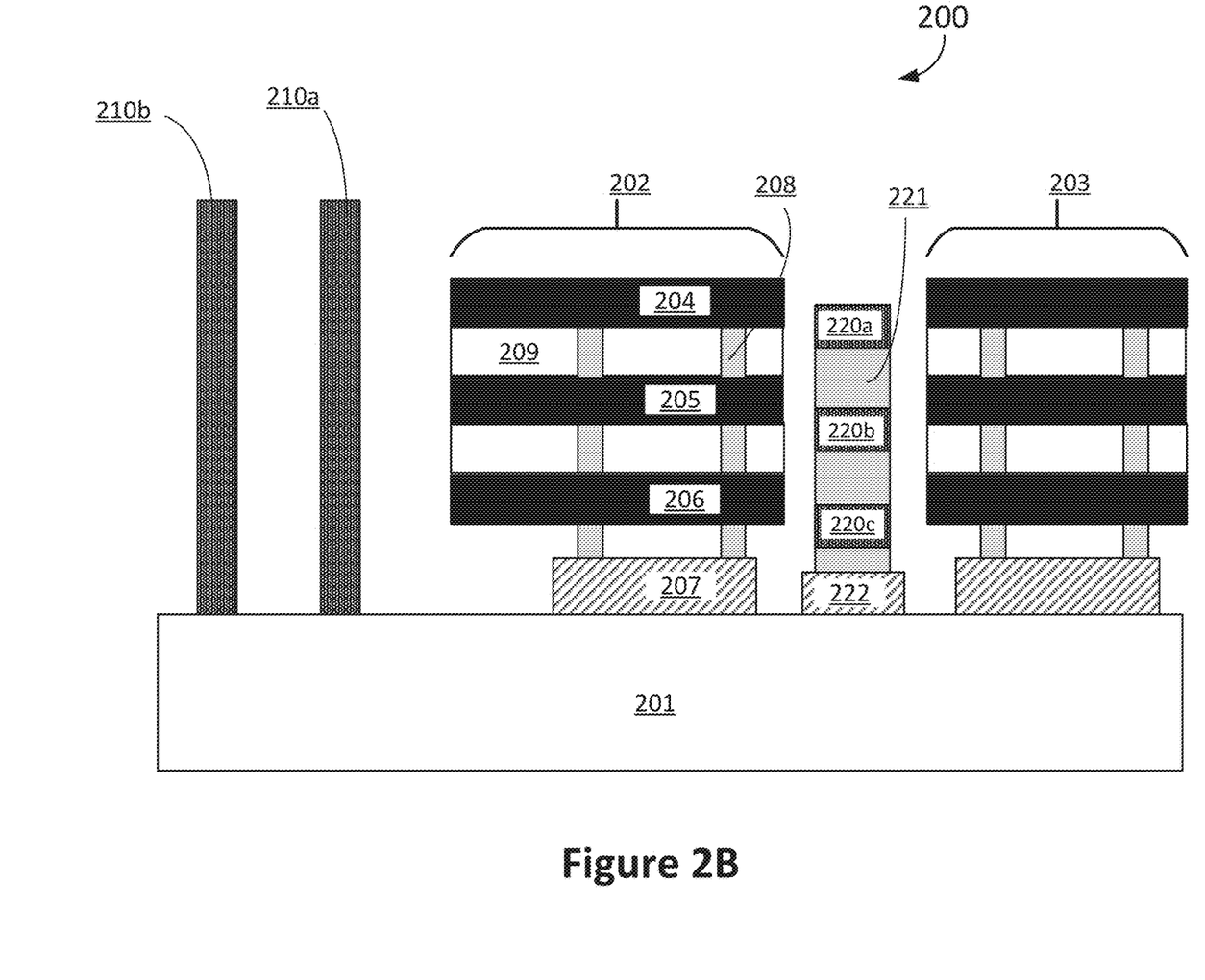

FIGS. 2A-2B are simplified diagrams illustrating a cross-section view of a substrate 200 having an inductor module according to embodiments of the subject technology. This diagram merely provides an example, which should not unduly limit the scope of the claims.

As previously noted, substrate 200 may include a dedicated region configured to accommodate one or more inductors, thereby forming an inductor module, which allows for the inductors to be integrated into the substrate, as opposed to being mounted on the surface. The inductor module may include one or more inductors, such as inductor 202 and/or inductor 203. The one or more inductors may be configured for various functions, such as energy storage, filtering, impedance matching, signal conditioning, and/or the like. In some implementations, a distance between inductor 202 and inductor 203 (e.g., denoted as d1) may be less than or equal to 0.1 mm.

In various examples, one or more inductors (e.g., inductors 202 and 203) may be characterized by a quality factor greater than or equal to 20 (e.g., at an operating frequency of 2 GHZ). The term "quality factor" or "Q factor" may refer to a parameter that describes the ratio of an inductor's reactance to its resistance at a specified frequency, representing its efficiency in storing energy. For instance, the Q factor can be measured using an LCR meter, which gauges inductance (L), capacitance (C), and resistance (R) at the operating frequency to determine the Q factor by calculating the ratio of inductance to the resistance. In some cases, one or more inductors (e.g., inductors 202 and 203) may be characterized by an inductance value of greater than 1 nH and less than 20 nH (e.g., at an operating frequency of 2 GHz). As an example, inductance may be measured using an LCR meter, which applies an alternating current (AC) to the inductor and measures the resulting voltage to calculate the inductance. The electrical characteristics of one or more inductors may be fine-tuned to achieve the desired performance for various applications, such as radio frequency communication, power conversion, and/or the like.

Each inductor may be arranged in various configurations, such as spiral, solenoid, toroidal, planar, and/or the like. For example, an inductor may include one or more turns of conductive elements (e.g., conductive traces or layers). The number of turns (e.g., three, four, five, etc.) may depend on the application and the desired inductance value of the inductor. A greater number of turns may increase the inductance value, allowing for better energy storage and filtering capabilities. Conversely, a smaller number of turns may be advantageous for applications requiring lower inductance values or operating at higher frequencies.

In various implementations, inductor 202 includes layer 204. Layer 204 may include a first metal material, which may include, without limitation, copper, silver, gold, aluminum, iron, and/or the like. Layer 205 may be coupled to layer 204 through interconnect 208. Layer 205 may include a second metal material, which may include, without limitation, copper, silver, gold, aluminum, iron, and/or the like. Depending on the implementation, the first metal material and the second metal materials may be the same or different. Interconnect 208 may include, without limitation, metal traces, vias, and/or other conductive materials and structures.

It is to be appreciated that the spacing between conductive layers (e.g., layers 204 and 206) may affect the inductor's characteristics and performance. For instance, a narrower spacing between layers may lead to an increase in inductance due to enhanced magnetic coupling. Conversely, wider spacing might decrease inductance, but it can also result in a higher self-resonant frequency and a reduction in parasitic capacitance. In some examples, a distance between layer 204 and layer 205 (e.g., denoted as d2), may be greater than or equal to 18 um. In certain embodiments, inductor 202 may further include layer 206 coupled to layer 205. Layer 206 may include a third metal material, which may include, without limitation, copper, silver, gold, aluminum, iron, and/or the like. In some embodiments, each layer may be characterized by a thickness ranging from 15 um to 35 um. The ability to adjust the spacing between conductive layers and the thickness of each layer provides a high degree of flexibility in tailoring the inductor's performance and characteristics to meet diverse operational requirements.

In some embodiments, layer 209 may be coupled between layer 204 and layer 205. Layer 209 may be configured to electrically insulate the conductive layers from each other (e.g., layer 204 and layer 205), preventing short circuits and reducing the eddy current losses. For instance, layer 209 may include a first dielectric material, which may include, without limitation, epoxy resin materials such as resin coated copper (RCC) and ajinomoto build-up film (ABF), or photo definable materials such as photosensitive polyimide (PID). In some cases, layer 209 may be characterized by a thickness of greater than or equal to 10 um.

According to some embodiments, inductor 202 may be coupled to the rest of substrate 200 (e.g., region 201). For instance, inductor 202 may be coupled to region 201 through interconnect 207. Depending on the implementation, interconnect 207 may include, without limitation, vias, traces, wires, bumps, solder balls, conductive pads, and/or the like.

Interconnect 207 provides a mechanical and electrical connection between inductor 202 and region 201, facilitating the integration of inductor 202 within substrate 200. Region 201 represents a section of substrate 200, which may support and interconnect various electronic components within the semiconductor package.

In various implementations, substrate 200 further includes one or more interconnects (e.g., interconnects 210a and 210b), which may be configured to surround the inductor module to prevent external electromagnetic interference from inducing noise in the inductors. These interconnects act as a barrier against external electromagnetic interference, ensuring signal integrity and reducing the impact of electromagnetic disturbances on the inductor's operation. A distance between an interconnect and an inductor may affect the shielding effectiveness and the coupling coefficient of the inductor. For instance, a distance between interconnect 210a and inductor 202 (e.g., denoted as d3) may be greater than or equal to 50 um. In some examples, a distance between interconnect 210a and interconnect 210b (e.g., denoted as d4) may be greater than or equal to 50 um.

In some embodiments, one or more isolation elements (also referred to as "isolation walls") may be positioned between adjacent inductors. As shown in FIG. 2B, one or more isolation elements (e.g., 200a, 200b, 200c) may be positioned between inductor 202 and inductor 203. For example, the term "isolation element" or "isolation wall" may refer to a structure within the substrate designed to provide electromagnetic separation and mitigate signal crosstalk, thereby preserving the integrity of each inductor's performance. The isolation wall may be configured to create a magnetic barrier that blocks or attenuates the magnetic flux leakage from one inductor to another, thereby increasing the isolation between inductors and improving the performance and efficiency of the circuit. The isolation walls are beneficial in 4G and 5G mobile systems, where maintaining distinct frequency bands is critical for system performance. The isolation walls ensure that inductors operate within their designated frequency ranges without interfering with neighboring components, ensuring the proper functioning of multi-band wireless devices. In various examples, an isolation element may include a conductive material, such as copper, aluminum, and/or the like.

In various implementations, interconnect 221 may be configured to couple isolation elements 220a and 220b. Interconnect 221 may provide a low-resistance path for the current flow between the isolation elements, increasing the shielding effectiveness of the isolation elements. Depending on the implementation, one or more isolation elements may interface with other sections of the substrate, offering an integrated solution for signal management. For instance, isolation element 222 may be coupled to region 201 (e.g., through solder balls), contributing to the overall reduction in signal noise and interference across substrate 200. Such a connection also serves to bolster the mechanical stability and electrical integrity of the isolation elements, minimizing stress and deformation of the substrate while enhancing thermal dissipation and circuit reliability.

Figure 3A:
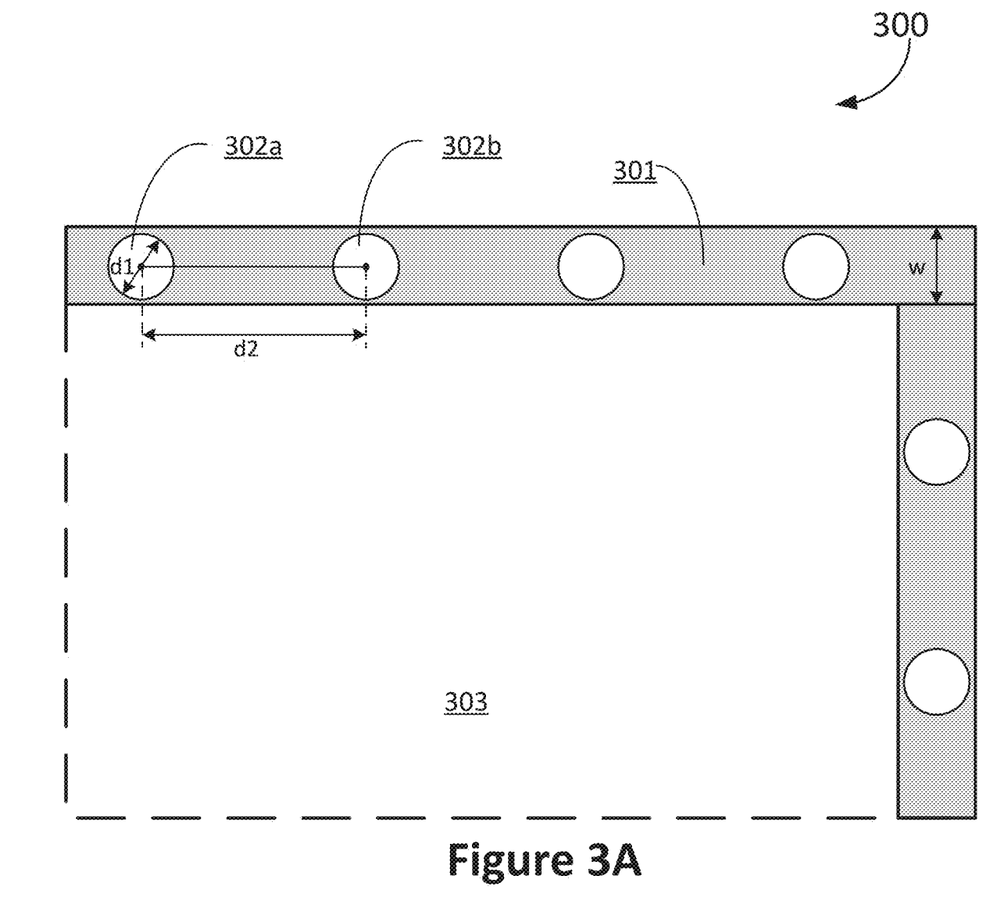
FIGS. 3A-3C are simplified diagrams illustrating a top view of a substrate having an inductor module according to embodiments of the subject technology.
Figure 3B:
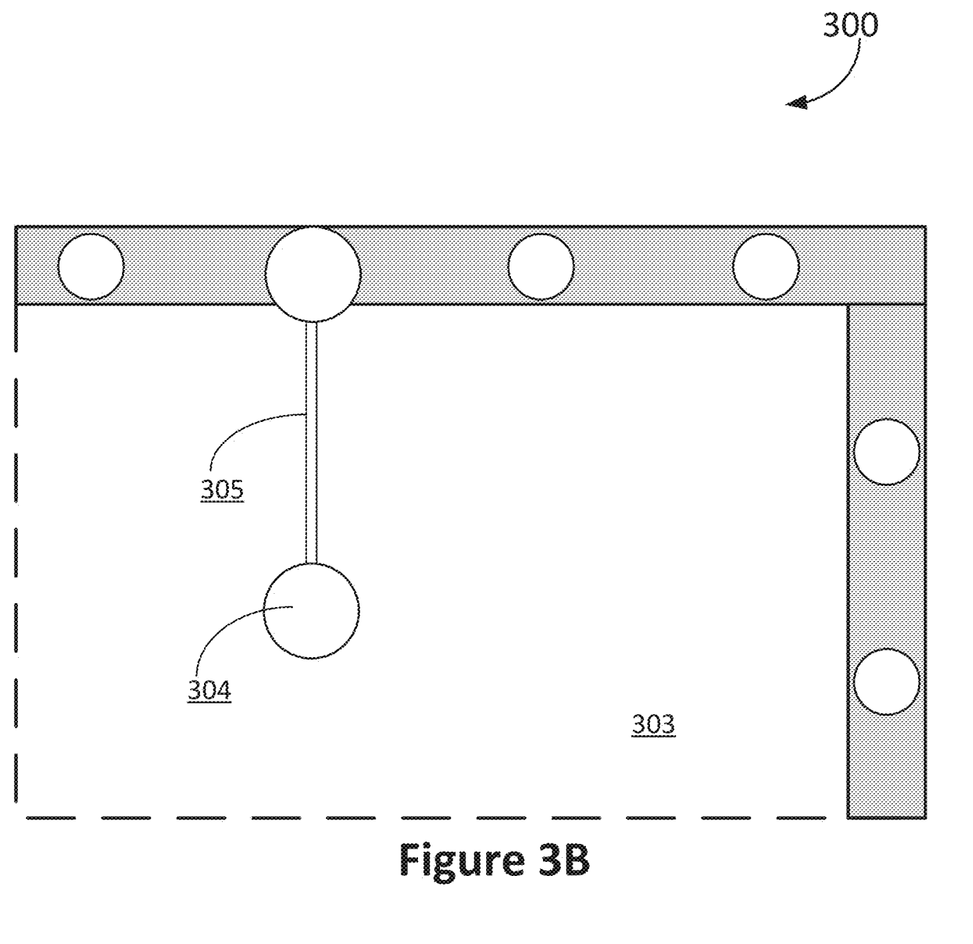
Figure 3C:
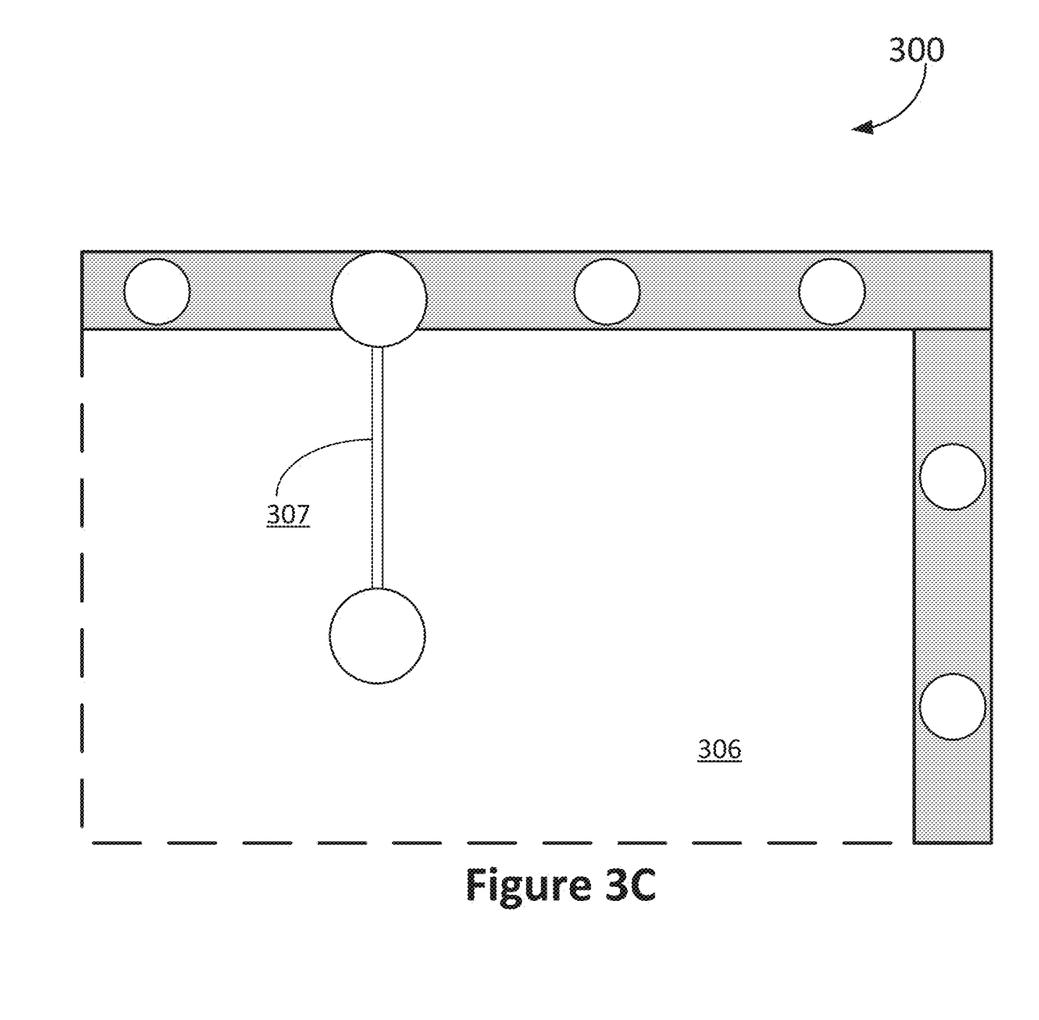

FIG. 3A-3C are simplified diagrams illustrating a top view of a substrate 300 having an inductor module according to embodiments of the subject technology. This diagram merely provides an example, which should not unduly limit the scope of the claims.

As shown, substrate 300 may include inductor module 303, which is a dedicated region within the substrate for accommodating one or more inductors (e.g., inductors 202 and 203 of FIG. 2). In some embodiments, inductor module 303 may be surrounded by one or more interconnects (e.g., interconnects 302a and 302b), which may be configured to surround the inductor module to prevent external electromagnetic interference from inducing noise in inductor module 303. For instance, interconnect 302a may include a via, which may be filled with conductive paste or electroplated metal, a wire bond, or the like.

Depending on the implementation, each interconnect may be configured in various shapes, such as circular, oval, rectangular, and/or the like. In some embodiments, a diameter of interconnect 302a (e.g., denoted as d1) may be greater than or equal to 100 um. A diameter of interconnect 302a may be less than or equal to 150 um. In some examples, a diameter of interconnect 302a may be less than or equal to 50 um. In various implementations, a pitch (e.g., the center-to-center distance between adjacent interconnects) may affect the current-handling capability and the reliability of the interconnect. For instance, a pitch (e.g., denoted as d2) between interconnect 302a and interconnect 302b may be greater than or equal to 150 um. In some cases, a pitch between interconnect 302a and interconnect 302b may be less than or equal to 300 um.

In various implementations, interconnect 302a may be coupled to trace 301. The term "trace" may refer to a continuous path of conductive material (e.g., copper) on the substrate that electrically connects different components within the semiconductor package. Trace 301 may facilitate the flow of electrical signals or power distribution between various components on substrate 300, including inductor module 303 and other circuit elements. In some examples, interconnect 302a may extend through substrate 300, enabling the connection of trace 301 to a grounding plane or other shielding structures. Interconnect 302a enhances electromagnetic isolation by providing a low-impedance path for potential interference to be grounded, ensuring the operational integrity of inductor module 303. Depending on the implementation, a width of trace 301 (e.g., denoted as w) may be greater than a diameter (e.g., d1) of interconnect 302a such that the outer edge of interconnect 302a does not exceed the edge of trace 301. For example, a width of trace 301 may be greater than or equal to 50 um. In some cases, a width of trace 301 may be 60 um.

According to some embodiments, substrate 300 may be engineered to optimize inductor performance through strategic interconnect positioning and configuration, which provides robust electrical connectivity and mechanical stability. The arrangement of trace 301 in relation to the interconnects (e.g., 302a and 302b) is designed to maximize shielding effectiveness, ensuring that inductor module 303 operates with minimal susceptibility to external interference. Accordingly, embodiments of the subject technology achieve seamless integration of the inductor module within the substrate, facilitating a minimized footprint with improved performance.

In various implementations, substrate 300 includes one or more isolation elements (also referred to as "isolation walls"). For example, as shown in FIG. 3B, substrate 300 further comprises isolation element 305. Isolation element 305 may be coupled to interconnect 304. Interconnect 304 may provide a low-resistance path for the current flow between the isolation elements, increasing the shielding effectiveness of the isolation elements. Depending on the implementation, isolation element 305 and/or interconnect 304 may be positioned between adjacent inductors within inductor module 303. The strategic placement of isolation element 305 contributes to the reduction of signal noise and interference, thereby preserving the integrity and performance of each inductor within substrate 300. This is particularly beneficial in applications where maintaining distinct frequency bands is essential for system performance.

In some embodiments, one or more isolation elements may interface with other sections of the substrate, offering an integrated solution for signal management. As shown in FIG. 3C, isolation element 307 may be coupled to region 306 of substrate 300 (e.g., through solder balls), contributing to the overall reduction in signal noise and interference across substrate 300. Such a connection also serves to bolster the mechanical stability and electrical integrity of the isolation elements, minimizing stress and deformation of the substrate while enhancing thermal dissipation and circuit reliability.

Figure 4:
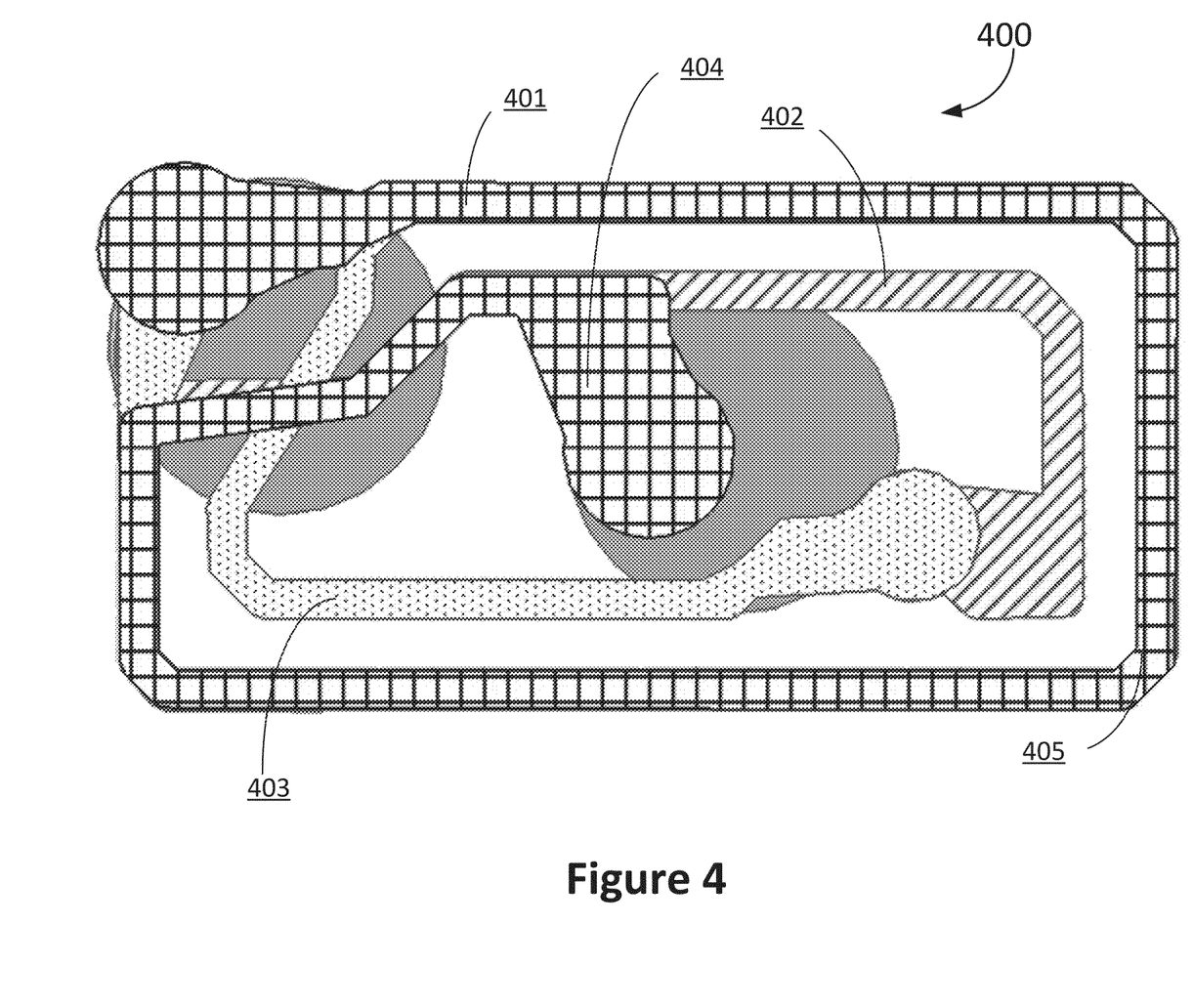
FIG. 4 is a simplified diagram illustrating a top view of an inductor according to embodiments of the subject technology.

FIG. 4 is a simplified diagram illustrating a top view of an inductor 400 according to embodiments of the subject technology. This diagram merely provides an example, which should not unduly limit the scope of the claims. As previously noted, inductor 400 may include one or more turns of conductive elements (e.g., conductive traces or layers). As shown in FIG. 4, inductor 400 includes layer 401, layer 402, and layer 403. Each layer may be patterned to form a wire winding, which may be configured to carry an electric current and generate a magnetic field. For instance, a layer (e.g., layer 401) may be patterned into a spiraling or meandering shape with a plurality of bends (e.g., bend 405). For example, the bends may increase the inductance value and the quality factor of the inductor 400 by reducing the parasitic capacitance and the eddy current losses.

In various implementations, the width of the wire winding may vary along its length. Widening of wire winding at certain junctions or terminals may improve the electrical and mechanical performance of the inductor. For instance, layer 401 may include a termination 404, where the wire winding gradually widens toward the end. Such a configuration resembles the shape of a teardrop and may thus be referred to as a "teardrop configuration." The teardrop configuration enhances the mechanical stability of inductor 400 by expanding the surface area at the terminations. The broader endpoint provides a robust platform for soldering and other connection methods, effectively distributing mechanical stress and reducing the risk of detachment or breakage that can occur with thermal cycling and physical manipulation of the substrate.

Figure 5:
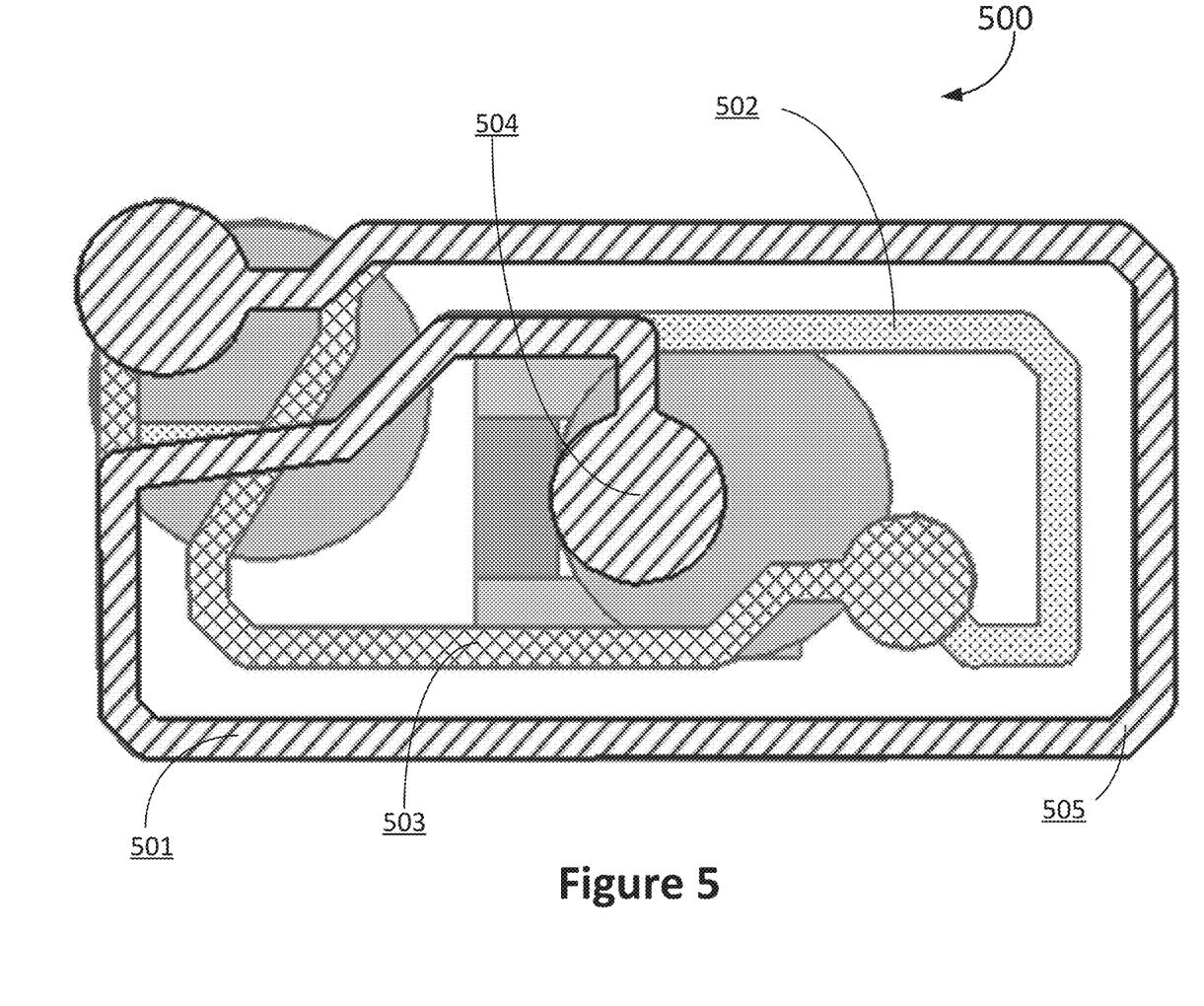
FIG. 5 is a simplified diagram illustrating a top view of an inductor according to embodiments of the subject technology.

FIG. 5 is a simplified diagram illustrating a top view of an inductor 500 according to embodiments of the subject technology. This diagram merely provides an example, which should not unduly limit the scope of the claims.

As shown, inductor 500 may include layer 501, layer 502, and layer 503. Similar to inductor 400, each layer may be patterned to form a wire winding, which may be configured to carry an electric current and generate a magnetic field. For instance, a layer (e.g., layer 501) may be patterned into a spiraling or meandering shape with a plurality of bends (e.g., bend 505). The bends may increase the inductance value and the quality factor of the inductor 500 by reducing the parasitic capacitance and the eddy current losses. In contrast with inductor 400, however, termination 504 of layer 501 is characterized by a reduced profile and maintains a consistent width along the length of wire winding. The elimination or reduction of the teardrop configuration in termination 504 aids in achieving a higher Q factor by lessening the surface area where parasitic capacitance could potentially accumulate. Furthermore, such a configuration allows for a more uniform current distribution throughout the inductor, preventing the concentration of current at any point, which could otherwise lead to increased losses and heating.

Figure 6:
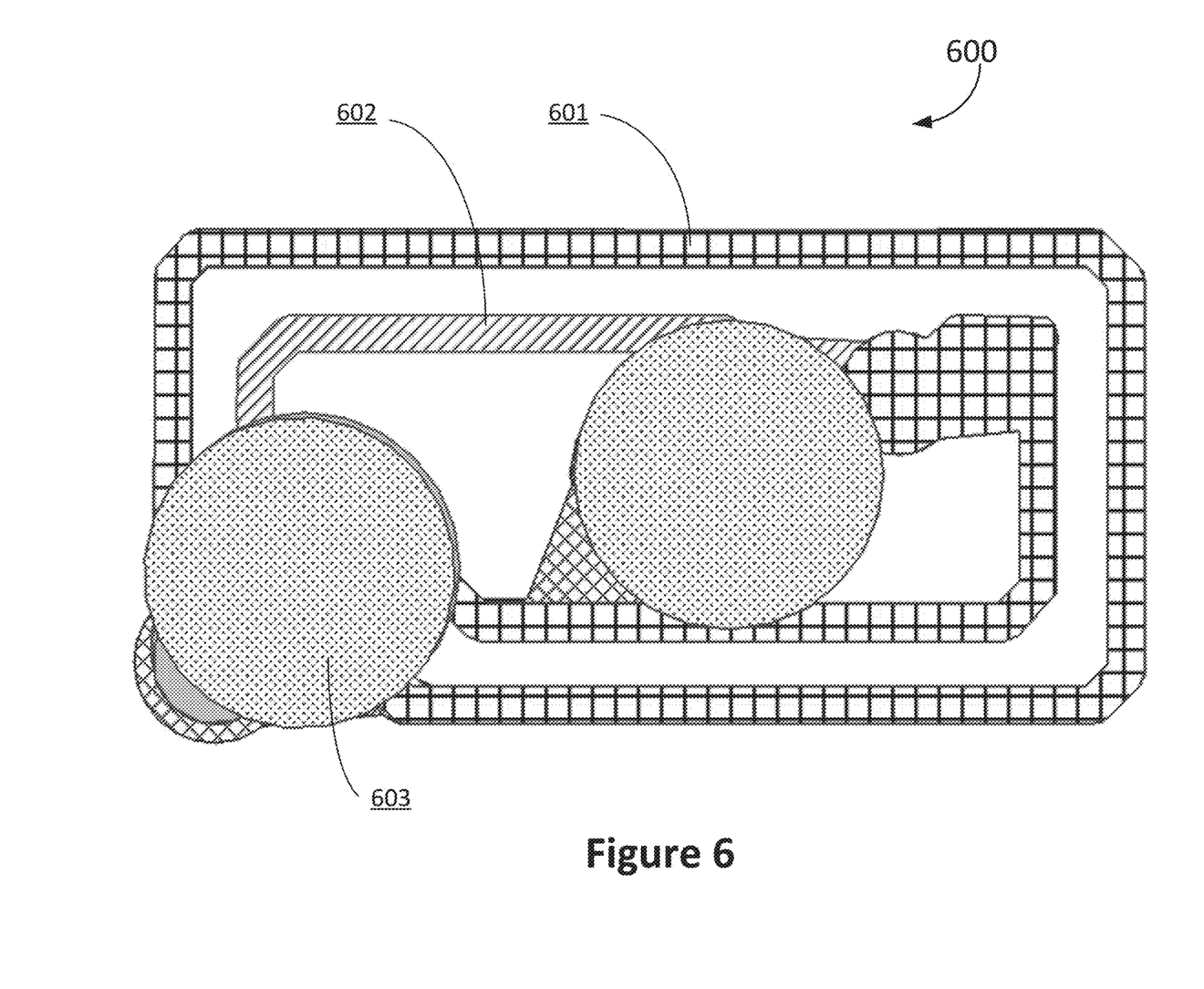
FIG. 6 is a simplified diagram illustrating a bottom view of an inductor according to embodiments of the subject technology.

FIG. 6 is a simplified diagram illustrating a bottom view of an inductor 600 according to embodiments of the subject technology. This diagram merely provides an example, which should not unduly limit the scope of the claims. As shown, inductor 600 may include layer 601 and layer 602. Similar to inductor 400 and inductor 500, each layer may be patterned to form a wire winding, which may be configured to carry an electric current and generate a magnetic field. Interconnect 603 may be coupled to a bottom layer (e.g., layer 602) and configured to qual to 20 um. the substrate. Interconnect 603 may include, without limitation, vias, traces, wires, bumps, solder balls, conductive pads, and/or the like. In some examples, interconnect 603 may be part of a ball grid array (BGA) or land grid array (LGA), allowing for improved current handling and a reduced likelihood of connection failure under thermal stress. A diameter of interconnect 603 may be designed to provide a balance between electrical conductivity and mechanical stability. For instance, a diameter of interconnect 603 may be greater than or equal to 100 um, ensuring a substantial conductive area for electrical currents. In some examples, a diameter of interconnect 603 may be less than or equal to 150 um, allowing for dense packing on the substrate.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. An apparatus comprising a substrate, the substrate comprising:
   a first layer; and
   a first inductor coupled to the first layer, the first inductor comprising:
      a second layer comprising a first metal material;
      a first interconnect coupled to the second layer;
      a third layer coupled to the second layer through the first interconnect, the third layer comprising a second metal material; and
      a fifth layer coupled between the second layer and the third layer, the fifth layer comprising an epoxy resin material or a photo definable material;
   wherein the first inductor is characterized by a first thickness, the first thickness is less than or equal to 250 um.

2. The apparatus of claim 1, further comprising a first circuit coupled to a first side of the substrate, the first circuit comprising a second side;
   wherein a first distance between the second layer and the second side is less than or equal to 300 um.

3. The apparatus of claim 1, further comprising a fourth layer coupled to the first layer, the fourth layer being configured to provide electromagnetic interference shielding for the first inductor.

4. The apparatus of claim 3, further comprising a second interconnect coupled to the fourth layer, a second distance between the second interconnect and the first inductor being greater than or equal to 50 um.

5. The apparatus of claim 4, wherein the first layer comprises a first opening, the second interconnect comprises a first region positioned in the first opening.

6. The apparatus of claim 1, further comprising a fifth layer coupled between the second layer and the third layer, the fifth layer comprising a first dielectric material.

7. The apparatus of claim 1, wherein the first layer comprises a pre-impregnated material.

8. The apparatus of claim 1, wherein the first inductor is characterized by a quality factor of greater than or equal to 20.

9. The apparatus of claim 1, wherein the first inductor is characterized by an inductance value of greater than 1 nH and less than 20 nH.

10. An apparatus comprising a substrate, the substrate comprising:
- a first layer characterized by a first thickness of less than or equal to 200 um; and
- a first inductor coupled to the first layer, the first inductor comprising:
  - a second layer comprising a first metal material;
  - a first interconnect coupled to the second layer; and
  - a third layer coupled to the second layer through the first interconnect, the third layer comprising a second metal material; and
- a fifth layer coupled between the second layer and the third layer, the fifth layer comprising an epoxy resin material or a photo definable material;
- wherein the first inductor is characterized by an inductance value of greater than 1 nH and less than 20 nH.

11. The apparatus of claim 10, further comprising a second inductor coupled to the first layer, a first distance between the first inductor and the second inductor being less than or equal to 0.1 mm.

12. The apparatus of claim 10, further comprising a first circuit coupled to a first side of the substrate, the first circuit comprising a second side;
- wherein a second distance between the second layer and the second side is less than or equal to 300 um.

13. The apparatus of claim 10, further comprising a fourth layer coupled to the first layer, the fourth layer being configured to provide electromagnetic interference shielding for the first inductor.

14. The apparatus of claim 13, further comprising a second interconnect coupled to the fourth layer.

15. The apparatus of claim 10, wherein the first layer comprises a pre-impregnated material.

16. The apparatus of claim 10, wherein the second layer and the third layer are characterized by a third distance of greater than or equal to 18 um.

17. An apparatus comprising:
- a first circuit comprising a first side; and
- a substrate coupled to the first circuit, the substrate comprising:
  - a first layer; and
  - a first inductor coupled to the first layer, the first inductor comprising:
- a second layer comprising a first metal material;
- a first interconnect coupled to the second layer;
- a third layer coupled to the second layer through the first interconnect, the third layer comprising a second metal material; and
- a fifth layer coupled between the second layer and the third layer, the fifth layer comprising an epoxy resin material or a photo definable material;
- wherein a first distance between the second layer and the first side is less than or equal to 300 um.

18. The apparatus of claim 17, wherein the first distance is less than or equal to 80 um.

19. The apparatus of claim 17, further comprising a fourth layer coupled to the first layer, the fourth layer being configured to provide electromagnetic interference shielding for the first inductor.

* * * * *